United States Patent
Huang et al.

(10) Patent No.: US 10,879,883 B2
(45) Date of Patent: Dec. 29, 2020

(54) MULTI-STATE PACKAGES

(71) Applicant: TEXAS INSTRUMENTS INCORPORATED, Dallas, TX (US)

(72) Inventors: Huanzhang Huang, Plano, TX (US); Jikai Chen, Allen, TX (US); Yanli Fan, Dallas, TX (US); Md Anwar Sadat, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/703,913

(22) Filed: Dec. 5, 2019

(65) Prior Publication Data

US 2020/0112302 A1    Apr. 9, 2020

Related U.S. Application Data

(63) Continuation of application No. 16/130,814, filed on Sep. 13, 2018, now Pat. No. 10,536,138.

(51) Int. Cl.
*H03K 5/15* (2006.01)
*H03K 5/24* (2006.01)

(52) U.S. Cl.
CPC ....... *H03K 5/15073* (2013.01); *H03K 5/2472* (2013.01)

(58) Field of Classification Search
None
See application file for complete search history.

(56) References Cited

U.S. PATENT DOCUMENTS

| 6,075,390 | A | 6/2000 | Shin et al. | |
| 8,487,650 | B2 * | 7/2013 | Fazeel | G11C 29/025 |
| | | | | 326/27 |
| 9,007,097 | B2 | 4/2015 | Chen | |
| 10,498,319 | B2 * | 12/2019 | Zhou | H03K 19/0175 |

* cited by examiner

*Primary Examiner* — Jeffrey S Zweizig
(74) *Attorney, Agent, or Firm* — John R. Pessetto; Charles A. Brill; Frank D. Cimino

(57) ABSTRACT

In examples, an integrated circuit package comprises a pin exposed externally to the package; at least one resistor coupled to the pin at a first end of the resistor; a first transistor coupled to the at least one resistor at a second end of the resistor and coupled to a voltage source; a second transistor coupled to the at least one resistor at the second end of the resistor and coupled to a ground connection, the at least one resistor and the first and second transistors couple at a first node, the first and second transistors are of different types; and multiple comparators, each of the multiple comparators coupled to a voltage divider network and to the pin.

12 Claims, 3 Drawing Sheets

| | VIN | | OUT <1:0> | |
|---|---|---|---|---|
| EXTERNAL PULL UP RESISTOR | INTERNAL R=50k, PULLDOWN | INTERNAL R=50k, PULLUP | INTERNAL R=50k, PULLDOWN | INTERNAL R=50k, PULLUP |
| 0 | VCC | VCC | 11 | 11 |
| 25k | 2/3VCC | VCC | 10 | 11 |
| 100k | 1/3VCC | VCC | 01 | 11 |
| OPEN | 0 | VCC | 00 | 11 |

| | VIN | | OUT <1:0> | |
|---|---|---|---|---|
| EXTERNAL PULL DOWN RESISTOR | INTERNAL R=50k, PULLDOWN | INTERNAL R=50k, PULLUP | INTERNAL R=50k, PULLDOWN | INTERNAL R=50k, PULLUP |
| 0 | 0 | 0 | 00 | 00 |
| 25k | 0 | 1/3VCC | 00 | 01 |
| 100k | 0 | 2/3VCC | 00 | 10 |
| OPEN | 0 | VCC | 00 | 11 |

| | VIN | | OUT <1:0> | |
|---|---|---|---|---|
| EXTERNAL PULL UP RESISTOR | INTERNAL R=100k, PULLDOWN | INTERNAL R=100k, PULLUP | INTERNAL R=100k, PULLDOWN | INTERNAL R=100k, PULLUP |
| 0 | VCC | VCC | 11 | 11 |
| 50k | 2/3VCC | VCC | 10 | 11 |
| 200k | 1/3VCC | VCC | 01 | 11 |
| OPEN | 0 | VCC | 00 | 11 |

| | VIN | | OUT <1:0> | |
|---|---|---|---|---|
| EXTERNAL PULL DOWN RESISTOR | INTERNAL R=100k, PULLDOWN | INTERNAL R=100k, PULLUP | INTERNAL R=100k, PULLDOWN | INTERNAL R=100k, PULLUP |
| 0 | 0 | 0 | 00 | 00 |
| 50k | 0 | 1/3VCC | 00 | 01 |
| 200k | 0 | 2/3VCC | 00 | 10 |
| OPEN | 0 | VCC | 00 | 11 |

FIG. 2A

|  | 236 | 238 | 240 | 242 | 244 |
|---|---|---|---|---|---|
|  |  | VIN | | OUT <1:0> | |
| 214 | EXTERNAL PULL UP RESISTOR | INTERNAL R=20k, PULLDOWN | INTERNAL R=20k, PULLUP | INTERNAL R=20k, PULLDOWN | INTERNAL R=20k, PULLUP |
|  | 0 | VCC | VCC | 11 | 11 |
|  | 10k | 2/3VCC | VCC | 10 | 11 |
|  | 40k | 1/3VCC | VCC | 01 | 11 |
|  | OPEN | 0 | VCC | 00 | 11 |
|  |  | VIN | | OUT <1:0> | |
| 216 | EXTERNAL PULL DOWN RESISTOR | INTERNAL R=20k, PULLDOWN | INTERNAL R=20k, PULLUP | INTERNAL R=20k, PULLDOWN | INTERNAL R=20k, PULLUP |
|  | 0 | 0 | 0 | 00 | 00 |
|  | 10k | 0 | 1/3VCC | 00 | 01 |
|  | 40k | 0 | 2/3VCC | 00 | 10 |
|  | OPEN | 0 | VCC | 00 | 11 |
|  |  | VIN | | OUT <1:0> | |
| 222 | EXTERNAL PULL UP RESISTOR | INTERNAL R=200k, PULLDOWN | INTERNAL R=200k, PULLUP | INTERNAL R=200k, PULLDOWN | INTERNAL R=200k, PULLUP |
|  | 0 | VCC | VCC | 11 | 11 |
|  | 100k | 2/3VCC | VCC | 10 | 11 |
|  | 400k | 1/3VCC | VCC | 01 | 11 |
|  | OPEN | 0 | VCC | 00 | 11 |
|  |  | VIN | | OUT <1:0> | |
| 224 | EXTERNAL PULL DOWN RESISTOR | INTERNAL R=200k, PULLDOWN | INTERNAL R=200k, PULLUP | INTERNAL R=200k, PULLDOWN | INTERNAL R=200k, PULLUP |
|  | 0 | 0 | 0 | 00 | 00 |
|  | 100k | 0 | 1/3VCC | 00 | 01 |
|  | 400k | 0 | 2/3VCC | 00 | 10 |
|  | OPEN | 0 | VCC | 00 | 11 |
|  | 256 | 258 | 260 | 262 | 264 |

FIG. 2B

MULTI-STATE PACKAGES

CROSS REFERENCE TO RELATED APPLICATION(S)

This continuation application claims priority to U.S. patent application Ser. No. 16/130,814, filed Sep. 13, 2018, which is incorporated herein by reference in its entirety.

SUMMARY

In examples, an integrated circuit package comprises a pin exposed externally to the package; at least one resistor coupled to the pin at a first end of the resistor; a first transistor coupled to the at least one resistor at a second end of the resistor and coupled to a voltage source; a second transistor coupled to the at least one resistor at the second end of the resistor and coupled to a ground connection, the at least one resistor and the first and second transistors couple at a first node, the first and second transistors are of different types; and multiple comparators, each of the multiple comparators coupled to a voltage divider network and to the pin.

In examples, a device comprises a pin; a resistor coupled to the pin at a first node; a first metal oxide semiconductor field effect transistor (MOSFET) coupled to the resistor at a second node and to a voltage source; a second MOSFET coupled to the first resistor at the second node and to a ground connection; a first resistor-capacitor circuit coupled to the first node; multiple comparators, each of the multiple comparators coupled to the first resistor-capacitor circuit; and a voltage divider network coupled to each of the multiple comparators via a different resistor-capacitor circuit.

In examples, a system comprises a first resistor coupled to a voltage source, a second resistor coupled to a ground connection, and a package. The package comprises a pin exposed externally to the package and coupled to the first and second variable resistors; a resistor coupled to the pin at a first node; a first metal oxide semiconductor field effect transistor (MOSFET) coupled to the resistor at a second node and to the voltage source; a second MOSFET coupled to the first resistor at the second node and to the ground connection; a first resistor-capacitor circuit coupled to the first node; multiple comparators, each of the multiple comparators coupled to the first resistor-capacitor circuit; and a voltage divider network coupled to each of the multiple comparators via a different resistor-capacitor circuit.

BRIEF DESCRIPTION OF THE DRAWINGS

For a detailed description of various examples, reference will now be made to the accompanying drawings in which:

FIGS. 2A and 2B show a state configuration table in accordance with examples.

DETAILED DESCRIPTION

Figure 1:
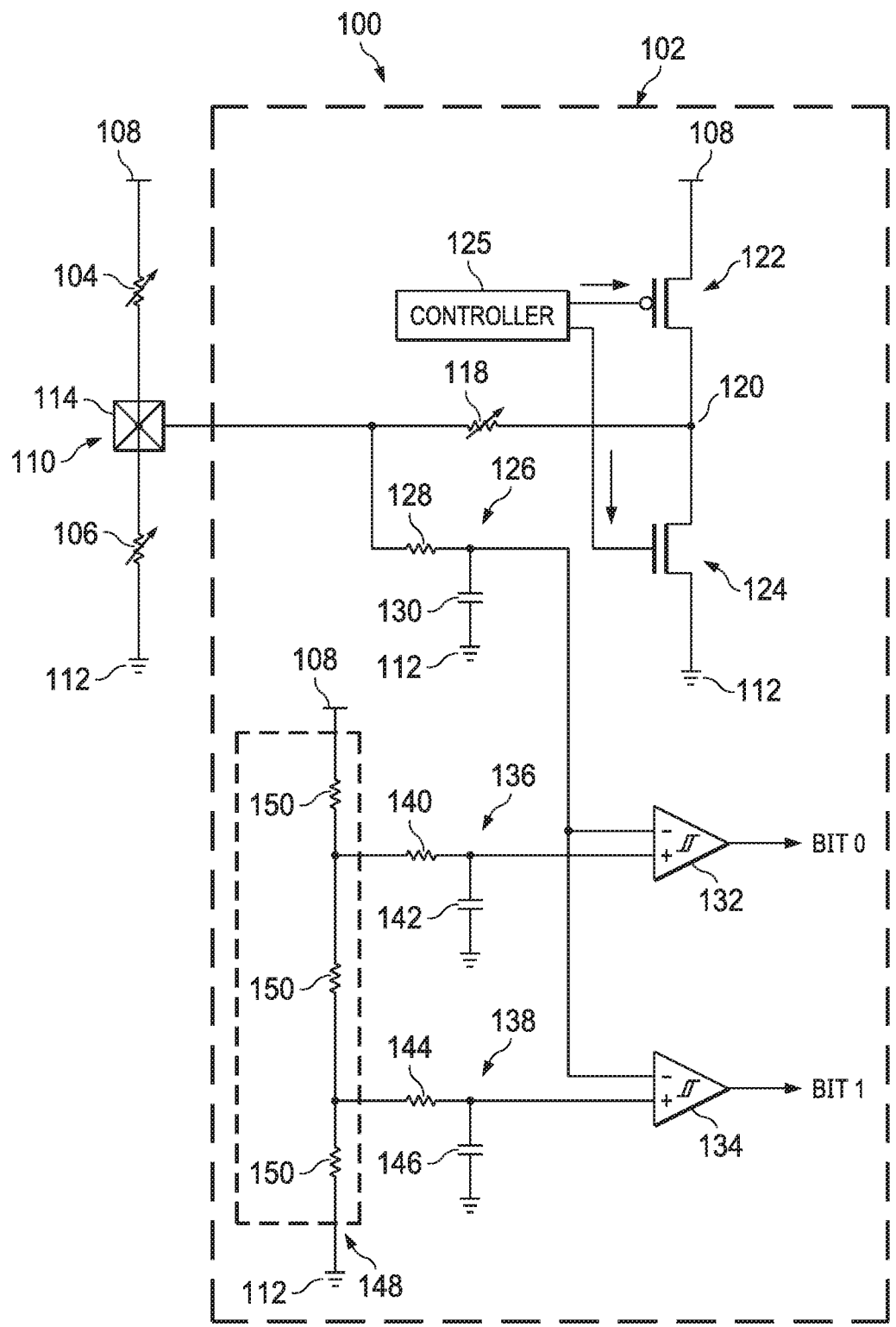
FIG. 1 shows a circuit diagram in accordance with examples.

Packages are hermetically sealed devices that contain electronics designed to perform one or more specific operations. The electronics housed within a package communicate with other electronics outside of the package by way of multiple metallic pins that extend from within the package to an external surface of the package.

Typically, a large number of package pins affords operational flexibility to the package. For example, a package with many pins is generally able to perform a greater number and variety of simultaneous operations than is a package with only a single pin. There is pressure within the industry, however, to continually reduce package size, thereby reducing attendant costs, space requirements, etc. A reduction in package size typically entails a commensurate reduction in pin count. A reduction in pin count, in turn, typically entails a reduction in operational flexibility for the package.

Disclosed herein are various examples of a system that confers greater operational flexibility to a relatively small number of package pins than would otherwise be the case. This permits comparable operational flexibility between larger packages with greater pin counts and smaller, more advantageously-sized packages with smaller pin counts. An example system includes a first resistor coupled to a voltage source, a second resistor coupled to a ground connection, and a package. The package comprises a pin exposed externally to the package and coupled to the first and second variable resistors, a resistor coupled to the pin at a first node, and a first metal oxide semiconductor field effect transistor (MOSFET) coupled to the resistor at a second node and to the voltage source. The package also comprises a second MOSFET coupled to the first resistor at the second node and to the ground connection, a first resistor-capacitor circuit coupled to the first node, and multiple comparators, each of the multiple comparators coupled to the first resistor-capacitor circuit. The package further comprises a voltage divider network coupled to each of the multiple comparators via a different resistor-capacitor circuit.

FIG. 1 depicts an example system 100. The system 100 includes a package 102 and external resistors 104, 106. The resistors 104, 106 are described as being "external" because they are external to the package 102. In examples, the resistors 104, 106 are adjustable resistors. The resistor 104 couples to a voltage source 108 and to a node 110. The resistor 106 couples to a ground connection 112 and to the node 110. The package 102 comprises a pin 114 coupled to the node 110. The pin is a metallic pin that is exposed external to the package 102—for example, to couple to the node 110. The package 102 further includes a resistor 118 that couples to the node 110 at one end of the resistor 118 and to a node 120 at another end of the resistor 118. In examples, the resistor 118 is adjustable. The package 102 further comprises switches 122, 124. In examples, the switches 122, 124 are transistors. In examples, the switches 122, 124 are metal oxide semiconductor field effect transistors (MOSFETs). In examples, the switches 122, 124 are p-type and n-type MOSFETs, respectively. In examples, the switches 122, 124 are n-type and p-type MOSFETs, respectively. In examples, the switches 122, 124 are bipolar junction transistors (BJTs). Other types of switches are contemplated and fall within the scope of this disclosure. The switch 122 couples to the voltage source 108 and the switch 124 couples to the ground connection 112. The switches 122, 124 couple at the node 120, which couples to resistor 118. In examples, the switches 122, 124 are controlled by a gate driver, a processor, or other suitable controller 125. In examples, the switches 122, 124 couple to package pins (not expressly shown) via which they are controlled by a controller (not expressly shown) external to the package 102. In examples, the resistor 118 is controlled by the controller 125. The resistors 104, 106 are controlled by any suitable entity outside of the package 102, such as a controller or a human operator. In examples, the resistors 104, 106 are controlled by the controller 125 via an output pin of the package 102.

In examples, the package 102 further comprises a resistor-capacitor circuit 126 coupled to the pin 114. The resistor-capacitor circuit 126 includes a resistor 128 and a capacitor 130. In examples, the resistor 128 has a resistance of approximately 500 kilo Ohms, although the scope of disclosure is not limited as such. In examples, the capacitor 130 has a capacitance of approximately 0.45 pico Farads, although the scope of this disclosure is not limited as such.

In examples, the package 102 further comprises comparators 132, 134. Although two comparators are shown, the scope of disclosure is not limited to any particular number of comparators. In examples, the comparator 132 is an n-type MOSFET (NMOS) comparator, and the comparator 134 is a p-type MOSFET (PMOS) comparator. An NMOS comparator uses an NMOS differential pair as the input stage while a PMOS comparator uses a PMOS differential pair as the input stage. A voltage divider network 148 will generate reference voltages (as described below) depending on the number of comparators used. PMOS comparators work with lower reference voltages, while NMOS comparators work with higher reference voltages. Comparators 132 and 134 are not limited to NMOS comparators and PMOS comparators. They can also be NPN and PNP comparators, Bi-Complementary MOS (Bi-CMOS) comparators, or rail-to-rail comparators. Other quantities and types of comparators are contemplated and included within the scope of this disclosure.

Each of the comparators 132, 134 has an input coupled to the resistor-capacitor circuit 126. In examples, each of the comparators 132, 134 also has an input coupled to another resistor-capacitor circuit—for instance, the comparator 132 has an input that couples to a resistor-capacitor circuit 136, and the comparator 134 has an input that couples to a resistor-capacitor circuit 138. The resistor-capacitor circuit 136 includes a resistor 140 and a capacitor 142, and the resistor-capacitor circuit 138 includes a resistor 144 and a capacitor 146. In examples, the resistors 140 and 144 range in resistance from approximately 200 kilo Ohms to approximately 600 kilo Ohms (and can differ from each other, as is the case with all resistors, capacitors, and other components described herein), and the capacitors 142, 146 are approximately 0.45 pico Farads in capacitance. The resistor-capacitor circuits 136, 138 couple to the voltage divider network 148, which includes multiple resistors 150 (e.g., ranging from approximately 80 kilo Ohms to approximately 120 kilo Ohms) and which couples to the voltage source 108 and to the ground connection 112. The resistor-capacitor circuits 126, 136, and 138 are used to smooth the signals provided to the comparators 132, 134. The outputs of comparators 132, 134 are bits BIT0 and BIT1, respectively.

Although the system 100 includes only a single pin 114, it is configurable so that an input value on that single pin can be interpreted to correspond to numerous different system states. For example, the system 100 can be modified according to a first configuration that is deemed to correspond to a first state, according to a second configuration that is deemed to correspond to a second state, and according to a third configuration that is deemed to correspond to a third state. In some examples, the system 100 can be configured to correspond to 19 or more states, using a single pin 114. The manner in which the system 100 is modified to correspond to different configurations is now described.

The parameters of the system 100 that are modifiable to produce different states recognized by the system 100 include the resistances of the external resistors 104 and 106, the resistance of the resistor 118, and the on/off states of the switches 122 and 124. Different combinations of these parameters will result in different state interpretations—for instance, one combination of these parameters will correspond to a first state, while a different combination of these parameters will correspond to a second, different state. In examples, the package 102 is hermetically sealed; thus, the resistor 118 is not accessible for adjustment after the package 102 has been sealed. Thus, in some examples, the resistor 118 is set to a desired resistance (e.g., 50 kilo Ohms) prior to sealing of the package 102. In other examples, the resistor 118 is dynamically controllable by the controller 125 or by a controller external to the package 102. The resistors 104, 106 are external to the package 102 and thus are adjustable even after the package 102 is sealed (e.g., in real-time). Similarly, although the switches 122 and 124 are enclosed within the sealed package 102, these switches are dynamically controlled by a controller that is within or outside the package 102 (e.g., controller 125). Thus, in some examples, the resistor 118 has a static resistance, while the resistances of the resistors 104, 106 and the on/off states of the switches 122, 124 are dynamic. In some examples, the resistor 104 is open (e.g., very high resistance, such as $1\times10^9$ kilo Ohms) while the resistor 106 has a resistance that is less than that of the resistor 104, and vice versa. In some examples, the switch 122 is open while the switch 124 is closed, and vice versa.

FIGS. 2A and 2B, now described simultaneously, depict a table 200 illustrating various system 100 states that can be implemented using the external resistors 104, 106, the resistor 118, and the switches 122, 124. Section 202 depicts states that are implemented when the resistor 118 has a resistance of approximately 50 kilo Ohms. Section 204 depicts states that are implemented when the resistor 118 has a resistance of approximately 20 kilo Ohms. Section 206 depicts states that are implemented when the resistor 118 has a resistance of approximately 100 kilo Ohms. Section 208 depicts states that are implemented when the resistor 118 has a resistance of approximately 200 kilo Ohms. (The resistance of the resistor 118 varies between, for example and without limitation, 20 and 200 kilo Ohms, inclusive.) Referring to section 202, a sub-section 210 depicts states that are implemented when the resistor 106 is open (meaning such a high resistance so that the circuit is essentially open at the resistor, e.g., $1\times10^9$ Ohms) and the resistor 104 is not, and sub-section 212 depicts states that are implemented when the resistor 104 is open and the resistor 106 is not. Similarly, section 204 contains sub-sections 214 and 216, which depict states that are implemented when the resistor 106 is open and resistor 104 is not, and when the resistor 104 is open and resistor 106 is not, respectively. Sub-sections 218 and 220 in section 206 and sub-sections 222 and 224 in section 208 are similarly configured.

Sub-sections 210 and 212 contain columns 226, 228, 230, 232, and 234. Sub-sections 214 and 216 contain columns 236, 238, 240, 242, and 244. Sub-sections 218 and 220 contain columns 246, 248, 250, 252, and 254. Sub-sections 222 and 224 contain columns 256, 258, 260, 262, and 264. Columns 226, 236, 246, and 256 indicate the resistance of a corresponding resistor 104, 106. Columns 228, 238, 248, and 258 indicate the voltage at pin 114 for a given resistance of resistor 118 when the switch 124 is on and the switch 122 is off. Columns 230, 240, 250, and 260 indicate the voltage at pin 114 for a given resistance of resistor 118 when the switch 124 is off and the switch 122 is on. Columns 232, 242, 252, and 262 indicate digital outputs of the comparators 132, 134 for a given resistance of resistor 118 when the switch 124 is on and the switch 122 is off. Columns 234, 244, 254, and 264 indicate digital outputs of the comparators 132, 134 for a given resistance of resistor 118 when the switch 124 is off and the switch 122 is on.

A few examples of the various states depicted in table 200 are now described. As explained above, the various states are implemented based on the configurations of the resistors 104 and 106, the resistor 118, and the switches 122 and 124. For instance, when the resistor 106 is adjusted so that the resistance is very high (e.g., 1×10⁹ kilo Ohms, or "open") and the resistor 104 has a very low resistance (e.g., approximately 0 kilo Ohms) as shown in the first row of column 226, and if the resistance of resistor 118 is approximately 50 kilo Ohms with the switch 122 being off and the switch 124 being on, the voltage at pin 114 will be the same as the voltage source 108 (denoted as "VCC" in the table 200), as shown in the first row of column 228. The resistances of the resistors 150 (which, in some examples, differ from each other) are configured to produce reference voltages at the inputs of the comparators 132, 134 such that the digital output from the comparators 132, 134 is "1 1," as shown in column 232. Similarly, when the resistor 106 is adjusted so that the resistance is very high ("open") and the resistor 104 has a resistance of 25 kilo Ohms as shown in the second row of column 226, and if the resistance of resistor 118 is approximately 50 kilo Ohms with the switch 122 being off and the switch 124 being on, the voltage at pin 114 is ⅔ of VCC, as shown in the second row of column 228. The resulting digital outputs of comparators 132, 134 are "1 0," as shown in the second row of column 232.

In a third example, the resistance of resistor 118 is 100 kilo Ohms as in section 206. Assuming the resistor 104 is "open" and the resistor 106 has a resistance of approximately 50 kilo Ohms as in the second row of column 246 in sub-section 220, and assuming that the switch 122 is off and the switch 124 is on, the voltage at pin 114 is ⅓ of VCC, as shown in the second row of column 250. The corresponding digital output from the comparators 132, 134 is "0 1," as shown in the second row of column 254. The remaining states shown in the table 200 are implemented in a manner consistent with the examples provided above.

For each configuration of resistors 104, 106, and 118, the controller 125 is programmed or otherwise caused to alternate the on and off states of the switches 122, 124 such that the switch 122 is on and switch 124 is off and such that the switch 122 is off and the switch 124 is on. In this way, each configuration of the resistors 104, 106, 118 produces a four bit code at the comparators 132, 134. For example, the first row of sub-section 210 produces a four-bit code "1 1 1 1," as shown in columns 232, 234. In another example, the second row of sub-section 222 produces a four-bit code "1 0 1 1," as shown in columns 262, 264. Each such four-bit combination, in tandem with a corresponding resistance of resistor 118 used to produce that four-bit combination, constitutes one "state" of the system 100. Thus, for instance, the first row of sub-section 210 has a bit combination of "1 1 1 1," and this bit combination, in tandem with the resistor 118 value of 50 kilo Ohms, constitutes a "state" of the system 100.

In the example of table 200, at least 19 different states are possible, although the scope of this disclosure is not limited to any particular number of states. More specifically, in examples, all floating conditions (no current flow through the pin 114, e.g., as in the bottom row of each of the sub-sections in table 200) collectively count as one state of the system 100. All of the top rows of the sub-sections 210, 214, 218, and 222 (configurations in which the resistor 104 is approximately 0 kilo Ohms) count as one state of the system 100. All of the top rows of the sub-sections 212, 216, 220, and 224 (configurations in which the resistor 106 is approximately 0 kilo Ohms) count as one state of the system 100. The second and third rows of each of the sub-sections count as two separate states, thus resulting in a total of 19 possible states. Additional configurations beyond those shown in table 200 (e.g., a different value of resistor 118 than those shown in the table) provide additional states. A controller or other digital logic (not expressly shown) receiving the outputs of the comparators 132, 134 and programmed with the value of the resistor 118 determines the state of the system 100 consistent with the foregoing description.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An integrated circuit for receiving multi-level analog inputs comprising:
   a resistor coupled to a first node at a first end of the resistor;
   a first transistor coupled to the resistor at a second end of the resistor and coupled to a voltage source;
   a second transistor coupled to the resistor at the second end of the resistor and coupled to a ground connection, the first and second transistors are of different types; and
   multiple comparators, the multiple comparators coupled to a voltage divider network and to the first node.

2. The integrated circuit of claim 1, wherein the at least one resistor has a resistance ranging between 20 kilo Ohms and 80 kilo Ohms, inclusive.

3. The integrated circuit of claim 1, wherein the first transistor comprises a p-type metal oxide semiconductor field effect transistor (MOSFET).

4. The integrated circuit of claim 1, wherein the second transistor comprises an n-type metal oxide semiconductor field effect transistor (MOSFET).

5. The integrated circuit package of claim 1, wherein the voltage divider network comprises multiple resistors, at least two of the multiple resistors having different resistance values.

6. A device comprising:
 a resistor coupled to a first node;
 a first metal oxide semiconductor field effect transistor (MOSFET) coupled to the resistor at a second node and to a voltage source;
 a second MOSFET coupled to the first resistor at the second node and to a ground connection;
 a first resistor-capacitor circuit coupled to the first node;
 multiple comparators, the multiple comparators coupled to the first resistor-capacitor circuit; and
 a voltage divider network coupled to each of the multiple comparators via a multiple second resistor-capacitor circuits.

7. The device of claim 6, wherein the resistor has a resistance ranging between 20 kilo Ohms and 80 kilo Ohms, inclusive.

8. The device of claim 6, wherein the first MOSFET is a p-type MOSFET and the second MOSFET is an n-type MOSFET.

9. The device of claim 6, wherein the first resistor-capacitor circuit comprises a resistance of at least 500 kilo Ohms.

10. The device of claim 6, wherein the first resistor-capacitor circuit comprises a capacitance of at least 0.45 pico Farads.

11. The device of claim 6, wherein at least two of the multiple second resistor-capacitor circuits comprise multiple second resistances.

12. The device of claim 6, wherein the device is configured to couple to third and fourth resistors via the first node, wherein the third resistor couples to the voltage source and the fourth resistor couples to ground.

* * * * *